United States Patent
Desprez et al.

(10) Patent No.: US 8,269,502 B2
(45) Date of Patent: Sep. 18, 2012

(54) METHOD FOR DETERMINING THE STATE OF HEALTH OF A BATTERY USING DETERMINATION OF IMPEDANCE AND/OR BATTERY STATE

(75) Inventors: Philippe Desprez, Le Taillan Medoc (FR); Philippe LaFlaquiere, Bordeaux (FR)

(73) Assignee: SAFT, Bagnolet (FR)

( * ) Notice: Subject to any disclaimer, the term of this patent is extended or adjusted under 35 U.S.C. 154(b) by 283 days.

(21) Appl. No.: 12/729,962

(22) Filed: Mar. 23, 2010

(65) Prior Publication Data

US 2010/0244846 A1    Sep. 30, 2010

(30) Foreign Application Priority Data

Mar. 24, 2009  (FR) ..................... 09 01371

(51) Int. Cl.
  *H01M 10/44* (2006.01)
  *H01M 10/46* (2006.01)
(52) U.S. Cl. ....................................................... 324/427
(58) Field of Classification Search .................. 320/107, 320/132, 149; 324/426, 427, 430, 431, 433
  See application file for complete search history.

(56) References Cited

U.S. PATENT DOCUMENTS

| | | | |
|---|---|---|---|
| 2003/0030414 A1 | 2/2003 | Suzuki | |
| 2003/0184307 A1* | 10/2003 | Kozlowski et al. | 324/427 |
| 2007/0046261 A1* | 3/2007 | Porebski | 320/132 |
| 2008/0150541 A1* | 6/2008 | Salman et al. | 324/430 |
| 2008/0235172 A1* | 9/2008 | Rosenstein et al. | 706/46 |

FOREIGN PATENT DOCUMENTS

EP    0 168 854 A1    1/1986

* cited by examiner

*Primary Examiner* — Edward Tso
(74) *Attorney, Agent, or Firm* — Sughrue Mion, PLLC

(57) ABSTRACT

A method for determining the state of health (SOH) of a battery is provided in which cell impedance is determined continuously, and including determining one or more confidence coefficients that depend on one or several variables selected from cell current, temperature or state of charge or their derivatives or integrals with respect to time, and continuously determining the state of health of the battery at a given point in time, using the state of health of the battery at a preceding point in time corrected as a function of cell impedance determined at the given point in time and weighted by the confidence coefficient or coefficients. The method provides a reliable way of determining the state of health of the battery with greater stability and robustness than existing methods.

18 Claims, 2 Drawing Sheets

METHOD FOR DETERMINING THE STATE OF HEALTH OF A BATTERY USING DETERMINATION OF IMPEDANCE AND/OR BATTERY STATE

BACKGROUND OF THE INVENTION

The present invention relates to a method for determining the state of health of a battery comprising a least one rechargeable cell.

An electrochemical cell or rechargeable cell (both terms being equivalent) is a device for producing electricity in which chemical energy is converted into electrical energy. The chemical energy is constituted by electrochemically active compounds deposited on at least one face of electrodes disposed in the cell. The electrical energy is produced by electrochemical reactions while the cell is discharging. The electrodes, which are placed in a container, are electrically connected to battery output terminals providing electrical continuity between the electrodes and a load with which the cell is associated.

The battery is designed to supply electrical energy to an external application and the charging circuit is generally provided to which the battery can be connected in order to charge the cells. To increase the power delivered, practice is to associate several sealed rechargeable cells in order to constitute a battery. The battery can include one or several parallel branches of series-connected cells. Battery charging and discharge management can then be organized and controlled in order to balance the charging and discharge of the various cells one with respect to the others. Management system, including measurement sensors and an electronic control circuit of greater or lesser sophistication depending on the applications may be associated with the battery.

The State of Charge (SOC) and State of Health (SOH) constitute useful information for an electronic battery management system, for optimizing use and lifetime. Typically, the state of charge SOC is determined as being the amount of energy available in the battery; it can be calculated by integrating charging/discharge current with respect to time. The state of health SOH of the battery makes it possible to determine ageing of the battery between a new condition and a deteriorated condition; it can be calculated as the ratio between battery impedance at a given point in time and battery impedance in its new condition, at the same temperature.

Determining the state of health of a battery as directly as impedance ratios is however not always reliable and can lead to a battery which is still in good condition being replaced or, on the contrary, to a lack of anticipating a failure, prejudicing the application for which the battery is intended.

A first way of determining the state of health of a battery consists in performing regular maintenance checks in order to determine internal resistance and/or capacitance of the battery, while disconnected from the external application or the charger. This means however that the battery is not available during these maintenance operations, which can be prejudicial to certain applications. Further, there is no evaluation of SOH between two maintenance operations.

Another way of determining state of health of a battery consists in monitoring values for temperature, and optionally voltage and optionally current exchanged, in order to determine a predictive value for SOH on the basis of tests previously performed in the laboratory. Any departure of battery behavior compared to nominal behavior will however not be detected. Such a method of determination is not reliable.

U.S. Pat. No. 7,202,632 proposes measuring battery impedance when certain criteria (of temperature and variation in current) are met, and then calculating SOH from this measurement as being the ratio of the calculated impedance to the initial impedance with application of weightings. The weightings defined in this patent correspond to a filter in the time domain. Measurements are however not performed continuously and it can happen that the SOH does not get evaluated over a fairly long period if the measurement conditions are not met.

U.S. Pat. No. 7,009,401 proposes measuring battery impedance at varying frequencies and with certain measurement conditions (for example, discharge current kept constant during measurement). This method does consequently also not provide continuous measurement of battery impedance regardless of operating conditions.

U.S. Pat. No. 7,324,902 discloses a method for determining the stage of charge and state of health of a battery by defining a complex model of the battery and performing a recursive determination starting from this model and functional relations between initial parameters. This method does not introduce weighting depending on battery state.

U.S. Pat. No. 7,072,871 proposes measuring a certain number of battery parameters and using fuzzy logic to calculate battery state of health. This method does not take account of the state of the battery, but solely the type of battery employed.

U.S. Pat. No. 6,534,954 discloses the use of a Kalman filter for determining state of charge. US-A-2006/0111854 discloses a method for battery internal parameter determination based on the use of a Kalman filter. The Kalman algorithm is an efficient way of determining states of a dynamic system using incomplete or noisy measurements. Nevertheless, the Kalman algorithm alone does not have sufficient stability to furnish a stable value for battery state of health. In effect, by definition, the Kalman algorithm increases variation on the parameter (for example impedance) it is monitoring when the parameter departs from the model, which can be the case when the battery is at a low SOC, or experiencing significant temperature variations. Under such conditions, the Kalman algorithm cannot but amplify SOH determination error.

The article "Li-ion battery SOC estimation method based on the reduced order Kalman filtering" by J. Lee et al, Journal of Power Sources, 174, 2007 (9-15) proposes determining battery impedance by a Kalman algorithm with a weighting that is dependent upon SOC. The values determined by the algorithm are rejected in regions of high or low SOC or when heavy currents are passing. Such weighting renders the Kalman algorithm more robust but does not make it possible to continuously monitor state of health of the battery regardless of battery operating conditions.

EP-A-1 688 754 discloses a method for measuring SOC. However, this method does not account on reliability of the measures.

SUMMARY OF THE INVENTION

There is consequently a need for a method for determining battery state of health which is reliable and which exhibits greater stability and robustness than known methods.

To achieve this, the invention proposes evaluating battery state of health SOH continuously using real time determination of impedance and with correction depending on battery state (temperature, SOC, current passing). The state of health of the battery at a given point in time is thus determined starting from the state of health of the battery at a previous point in time corrected as a function of impedance determined at the given point in time and weighted by confidence coefficients which depend on current and/or temperature and/or state of charge at the given point in time.

More particularly, the invention provides a method for determining the state of health of a battery comprising at least one rechargeable cell, the method including the steps of:
- determining in real time an impedance of at least one cell;
- determining at least one confidence coefficient which is a function of at least one variable selected from current, temperature or state of charge of the at least one rechargeable cell, or the derivatives or integrals thereof with respect to time;
- determining in real time the state of health of the battery at a given point in time, using the state of health of the battery at a preceding point in time corrected as a function of said impedance at the given point in time and weighted by the at least one confidence coefficient.

According to one embodiment, the method further includes a step of calculating an index of confidence for the value of the state of health of the battery determined at the given point in time, said index of confidence being calculated using the index of confidence at the preceding point in time and the at least one confidence coefficient.

According to one embodiment, the method further includes filtering in the time domain the value the state of health of the battery determined at said given point in time using a filter time constant selected such that a ratio of filter time constant to time step of the determination is greater than or equal to $10^4$.

According to one embodiment, the method further includes filtering in the time domain the value of the impedance determined at the given point in time using a filter time constant selected such that a ratio of filter time constant to time step of the determination is greater than or equal to 1000.

According to one embodiment, the method further includes calculating an intermediate state of health at said given point in time as a ratio of impedance at the given point in time to impedance of the cell in its new condition under the same conditions of temperature, wherein determination of state of health of the battery at the given point in time is a function of the state of health of the battery at the preceding point in time and the calculated intermediate state of health.

According to one embodiment, the state of health of the battery at the given point in time is determined using a Boolean method.

According to one embodiment, the time step in the real time determination is between 10 ms and 1 s.

According to one embodiment, determination of the impedance of at least one cell at the given point in time is performed by measuring cell current and voltage.

According to one embodiment, determination of the impedance of at least one cell at the given point in time is performed using a Kalman algorithm.

The invention also provides an electronic system for managing state of health of a battery comprising at least one rechargeable cell, the system including:
- means for measuring in real time an impedance of at least one rechargeable cell;
- electronic means adapted to perform the method for determining the state of health of the battery according to the invention.

According to one embodiment, the system further includes means for measuring temperature in real time of at least one cell.

According to one embodiment, the system further includes means for controlling battery charging and/or discharge as a function of the state of health determined.

The invention also provides a battery comprising at least one electrochemical rechargeable cell and an electronic system according to the invention.

Further characteristics and advantages of the invention will become more clear from reading the description which follows, provided by way of example and with reference to the attached drawings.

DETAILED DESCRIPTION OF PREFERRED EMBODIMENTS

Figure 1:
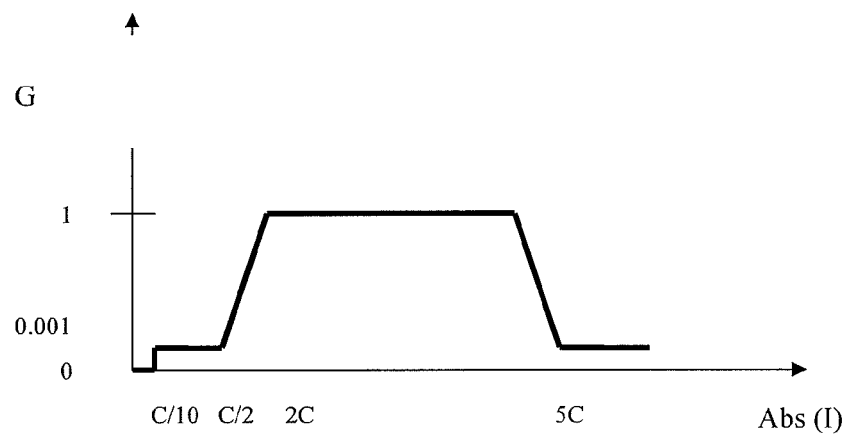
FIG. 1 shows a weighting function for determining a confidence index depending on current.

The invention provides a method for determining state of health SOH of a battery comprising a least one rechargeable cell. The invention applies to any type of rechargeable cell, such as for instance Li-ion, NiMH, NiCd or otherwise. The invention proposes determining battery state of health in real time. The SOH thus determined is of real use to a battery electronic management system in view of its precision, stability, robustness and fast response time.

The method of the invention includes a step consisting of determining, in real time, the impedance of a least one cell of the battery. One can measure the impedance of each rechargeable cell and obtain a mean value, or take the maximum impedance, for determining the impedance to be used in calculating the state of health of the battery; one can also measure impedance directly at the battery terminals without measuring values at each individual cell. Below, we shall refer to measuring impedance at the terminals of one cell.

When we speak of "real time determining" or "continuous", we mean regular measurement or estimation, with a time step n which is less than 1 second. Typically, the time step will be comprised between 10 ms and 1 s, for example 100 ms. Below 10 ms, the processing electronics and measurement sensors (current, voltage, temperature) may lack stability. Beyond 1 second, preciseness of the determination can be affected.

The method of the invention also includes a step of determining in real time the state of health of the battery at a given point in time $SOH_n$ starting out from the state of health of the battery at a preceding point in time $SOH_{n-1}$ corrected as a function of the impedance at the given point in time and weighted by confidence coefficients that are a function of current and/or temperature and/or state of charge at the given point in time. Thus, regardless of the state of the battery, SOH is determined continuously. No value of SOH is rejected, contrary to what is proposed in the article "Li-ion battery SOC estimation method based on the reduced order Kalman filtering" by J. Lee discussed above, but the confidence coefficients do make it possible to take account of bad operating conditions of the battery, as will be discussed in detail below.

A first step in the method of the invention consequently consists in evaluating online impedance of the battery, in other words without disconnecting the battery from the external application nor from the charger. Sensors are arranged in the battery in order to notably furnish values for currents exchanged (at each parallel branch of cells or at an output terminal of the battery), values for voltage (at the terminals of each cell or at the output terminals of the battery) and values for temperature.

In this way we determine, for instance in a computation circuit, a value for impedance $R_{mes,n}$ at each point in time n. In one embodiment, the impedance value $R_{mes,n}$ can be determined by measuring current and voltage in the cell using the relation:

$$R_{mes,n}=(V_n-E_{o,n})/I_n$$

with $V_n$ being the voltage measured at the cell terminals at the point in time n, $E_{o,n}$ being the theoretical no load voltage as a function of the SOC at the point in time n, and $I_n$ being the current measured at the cell input or output, at the point in time n.

Theoretical no load voltage $E_{o,n}$ can be a determined, on a lithium-ion type battery using the following basic algorithm:

if the current is low, we can liken the voltage to the emf or open circuit voltage (OCV) of the cell. We now have $E_{o,n}=V_n$. The state of charge of the cell is a function of emf, with SOC=f(emf). For higher currents, we perform a re-calibration: the state of charge at a given point in time $SOC_n$ is determined from this re-calibration using Coulomb counting and the capacity of the relevant cell or battery from:

$$SOC_n=SOC_{n-1}+Ah/\text{capa}$$

and $E_{o,n}$ is determined by the relation $E_{o,n}=\text{emf}=f^{-1}(SOC_n)$.

Impedance $R_{mes,n}$ measured in this way can be filtered using a filter in the time domain, for example an RTA (Run Time Averaging) algorithm using the following relation:

$$R'_{mes,n}=(r*R_{mes,n-1}+R_{mes,n})/(r+1)$$

where r is the time constant of the chosen filter such that the ratio of time constant of the filter to measurements step $(r/(t_n-t_{n-1}))$ is greater than 1000 in order to give good stability to the measurement.

In another embodiment, the value for impedance $R_{mes,n}$ can be determined using a Kalman algorithm such as for example the algorithm described in the article by J. Lee et al discussed above.

A second step in the method can consist in determining an intermediate value for state of health for a given point in time $(SOH_{int,n})$ defined by the relation:

$$SOH_{int,n}=R_{mes,n}/R_{new}$$

where $R_{new}$ is the nominal impedance of the cell or battery when new at a given temperature, at the time of measurement. Typically, each battery has a table for determining nominal resistance as a function of temperature associated with it. For example, for a battery consisting of 6 series Li-ion cells (assignee's model number VL6P), the table for determining nominal resistance as a function of temperature is as follows:

$$T=[-50-25-20-10\ 0\ 10\ 25\ 40\ 55\ 100];$$

$$R_{new}=[100\ 21\ 16\ 11.2\ 7.5\ 5.3\ 3.4\ 2.3\ 1.7\ 1.7]/1000.$$

Thus, at 25° C., the no load battery resistance is 3.4 mΩ.

In view of the extreme complexity of the behaviour of the cells of a battery, notably as a result of their non-linear behaviour with current, temperature and associated time constants, measurements of $R_{mes,n}$ taken in isolation and consequently the values for intermediate state of health $SOH_{int,n}$ are not reliable.

A third step in the method consists in determining confidence coefficients. These confidence coefficients have been introduced in order to take account of the reliability of impedance with current, temperature, state of charge, and time. All of these variables need to be considered in association with their dynamic character (dI/dt, dT/dt, dSOC/dt).

The invention proposes defining confidence coefficients for impedance determined at the given point in time $R_{mes,n}$ with all or some of the variables for current, temperature and SOC. These confidence coefficients are then employed for weighting the state of health $SOH_n$ determined at a given point in time. These confidence coefficients can also be employed for determining an index of confidence for the value of state of health $SOH_n$ determined at a given point in time.

Figure 2:
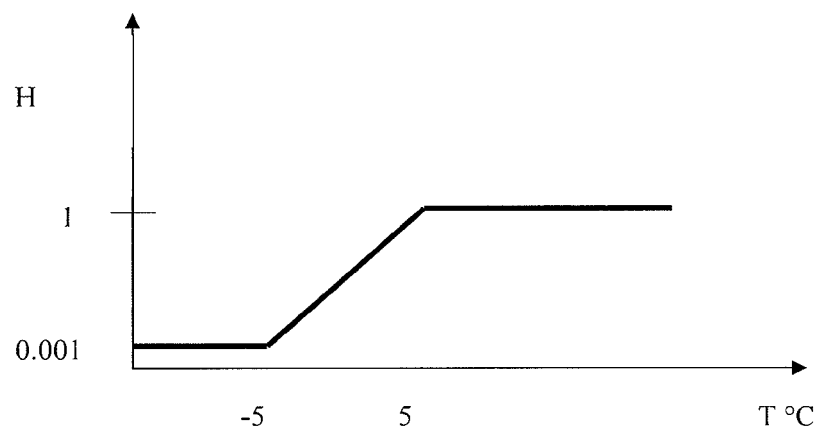
FIG. 2 shows a weighting function for determining a confidence index depending on temperature.
Figure 3:
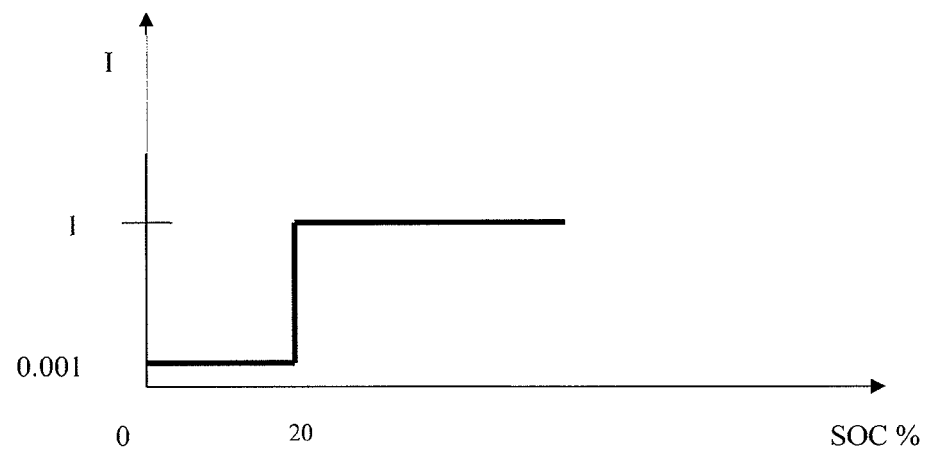
FIG. 3 shows a weighting function for determining a confidence index depending on SOC.

FIGS. 1 to 3 illustrate weighting functions which can be employed for determining respective confidence coefficients for current, temperature and SOC.

The weighting function of FIG. 1 makes it possible to determine a confidence coefficient G depending on current. This confidence coefficient G is given in relation to charging rate or discharging rate. We speak of "discharge" when the battery provides, under specific conditions, electrical energy produced inside the cells to an external circuit. We speak of "charge" when the battery cells receive electrical energy from an external circuit, leading to chemical modifications within the cells and thus to storage of energy. In this context, the expression "charging rate" relates to the electrical current under which the battery cells are charged. The charging rate is the reference current I=C/n where C is the assigned capacity declared by manufacturer and n is the basic time in hours for which the assigned capacity is declared. Similarly, the expression "discharging rate" relates to the electrical current under which the battery cells are discharged. The discharging rate is calculated by dividing the assigned capacity by the discharging time, giving an electrical current.

For instance, when measured current, in absolute value (in charging or discharge) is comprised between 2 and 4 times battery (or cell, depending on where measurement is made) capacity, the confidence coefficient depending on current is set at 1. Beyond 5C and between C/2 et C/10, the confidence coefficient is only 0.001, dropping off linearly between 4C and 5C and between 2C and C/2. Below C/10, the measurement is rejected, the confidence coefficient being zero. The only case where the impedance measurement is rejected corresponds to the case where it cannot be measured: on-line impedance can only be measured if the cell is experiencing a non-zero current.

The weighting function of FIG. 2 makes it possible to determine a confidence coefficient H dependent on temperature. The example, when the measured temperature is greater than 5° C., the confidence coefficient depending on temperature is equal to 1, while, below −5° C., the confidence coefficient depending on temperature is 0.001, with it dropping off linearly between these two values.

The weighting function of FIG. 3 makes it possible determine a confidence coefficient I depending on SOC. For example, when SOC is greater than 20%, the confidence coefficient depending on SOC is 1, while below 20%, it will only be 0.001.

We can thus determine, for each measurements performed at each point in time $R_{mes,n}$ confidence coefficients G, H, I which can optionally be developed from the derivative or integral of the weighting functions defined above. The confidence coefficients increase when reliability of the impedance becomes more important depending on current, temperature and or SOC. This is true from the above examples. For a low current, the voltage resolution does not allow to obtain a precise impedance measuring, thus a low confidence coefficient G. For a low temperature, the impedance is very sensitive to temperature variation, thus a low confidence coefficient H. For a low SOC, the impedance is very sensitive to small SOC variation, this a low confidence coefficient I.

These confidence coefficients can then be employed for weighting the determination of battery state of health at a given point in time, as discussed in detail below. These confidence coefficients can also be employed for determining an index of confidence as to the value determined for the state of health of the battery at a given point in time, as discussed in detail below.

A fourth step consists in then determining a value for battery state of health at a given point in time $SOH_n$. As indicated above, the conventional definition of state of charge consisting in calculating the ratio between measured impedance and no load resistance is not reliable, and above all is not sufficiently stable to be employed by an electronic battery management system. The invention provides determination of the value for state of health at a given point in time from the state of health of the battery at a preceding point in time as a function of impedance determined at the given point in time and waited with confidence coefficients which are a function of current and/or temperature and/or state of charge at the given point in time.

In a first embodiment, a Boolean method is employed without using the value for intermediate state of health $SOH_{int,n}$ defined above.

The law for Boolean determination takes account of the confidence coefficients determined from the weighting functions on current, temperature and SOC. This law of Boolean determination of state of charge at a given point in time $SOH_n$ can be written as follows:

If $(R_{mes,n})>aa*R_n+bb$, with $Rn=SOH_{n-1}*R_{new}$, and with aa, bb decimal coefficients for determining the Boolean relation then $SOH_n=SOH_{n-1}+a*(G*H*I)$ otherwise $SOH_n=SOH_{n-1}-b*(G*H*I)$ with a and b decimal coefficients for correcting the value of the state of health of the battery at the given point in time.

This Boolean law may employ hysteresis

If $(R_{mes,n})>aa*R_n+bb$, then $SOH_n=SOH_{n-1}+a*(G*H*I)$ otherwise if $(R_{mes,n})<(2-aa)*R_n-bb$ then $SOH_n=SOH_{n-1}-a*(G*H*I)$ otherwise $SOH_n=SOH_{n-1}$ using the same definitions as previously.

Figure 4:
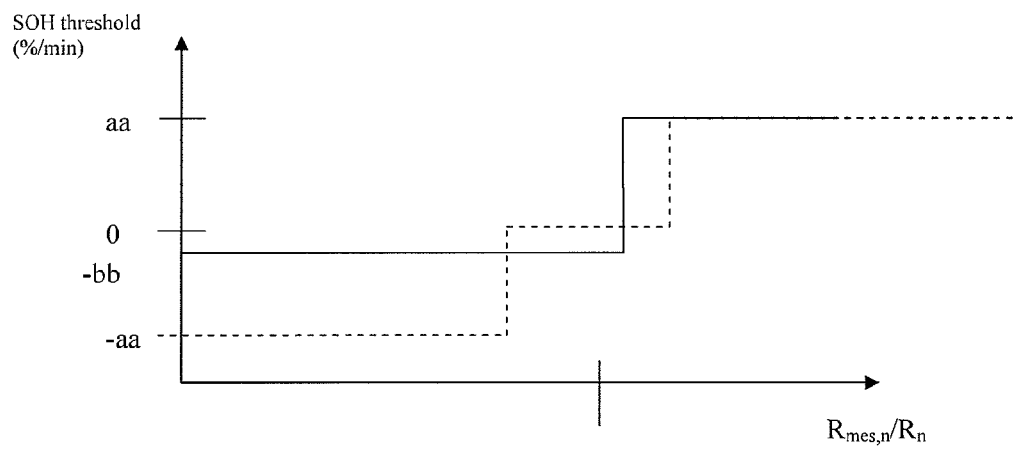
FIG. 4 is a graph showing determination of SOC according to a first embodiment of the invention.

FIG. 4 illustrates diagrammatically Boolean determination of the value for state of health of the battery at a given point in time from the state of health of the battery at a preceding point in time, without hysteresis (solid line) or with hysteresis (dotted line). For example aa=1.05 and bb=0.03*$R_{new}$; and a=0.001 and b=0.00001; and $t_n-t_{n-1}$=100 ms. With such coefficients, the correction only applies if variation in impedance is greater than 5% and is the difference with respect to the resistance of the battery when new is greater than 3%.

The above relations do indeed demonstrate that the confidence coefficients G, H and I will make it possible to apply a weighting to the value of SOH determined at a given point in time. Notably, if operating conditions are unfavorable, in other words if one or several indices of confidence are low, the value for SOH at a given point in time will remain close to the preceding value in order to preserve continuity of determination. When the confidence coefficients G, H, I close to 1, correction of the value for SOH at a given point in time can be performed starting from the preceding value and as a function of the impedance measured. Thus, once the unfavorable operating conditions have been overcome (low SOC or low temperature for example), determination of SOH will proceed again with larger corrections as a function of measured impedance.

Notably, an index of confidence can be associated to the value for state of health $SOH_n$ determined at a given point in time. For instance, the index of confidence can be determined using the following relation:

$$IndConf\_SOH_n=[IndConf\_SOH_{n-1}+a*(G*H*I)]/(1+a)$$

with G, H and I being the confidence coefficients defined above and a being the correction coefficient for the value of battery state of health at the given point in time, defined in the Boolean law.

This index of confidence $IndConf\_SOH_n$ provides an appropriate way for treating the value for SOH determined at a given point in time. Thus, without interrupting determination of SOH by rejecting values because operating conditions are unfavorable, the index of confidence does make it possible to identify those values of SOH determined under unfavorable conditions, and to treat these values appropriately. For example, fuzzy logic monitoring of the SOH and index of confidence can be employed in an electronic battery management system in order to only trigger alarms when SOH is bad with a high index of confidence and/or when the index of confidence remains below a threshold value for a significant period of time.

Further, values for state of health determined at a given point in time $SOH_n$ can additionally be filtered using a filter in the time domain, for example the RTA algorithm discussed above:

$$SOH'_n=(x*SOH_{n-1}+SOH_n)/(x+1)$$

with x being the time constant of the chosen filter such that the ratio of filter time constant to measurement step $(x/(t_n-t_{n-1}))$ is greater than or equal to $10^4$ in order to well stabilize the value for state of health determined.

According to a second embodiment, the state of health of the battery at a given point in time $SOH_n$ is determined using the value for the intermediate state of health $SOH_{int,n}$ defined above. The state of health of the battery at the point in time n can thus be determined from the following relation:

$$SOH_n=SOH_{n-1}+(G \cdot H \cdot I) \cdot SOH_{int,n}$$

State of health of the battery is in effect determined at point in time n from the state of health of the battery at a preceding point in time corrected as a function of impedance at the given point in time $R_{mes,n}$ since the intermediate state of health $SOH_{int,n}$ is directly calculated from the impedance at point in time n.

Like in the first embodiment, the confidence coefficients G, H and I will allow the value of SOH determined at a given point in time to be weighted. If operating conditions are unfavorable, the value of SOH at a given point in time will remain close to the preceding value, in order to preserve continuity of determination. When the confidence coefficients G, H, I are close to 1, correction of the value for SOH at a given point in time can be performed starting from the preceding value and as a function of the intermediate state of health, taking account of the measured impedance.

This second embodiment also provides filtering in the time domain of the value for state of health determined at a point in time n with a time constant x of the order of 1000 s to 10000 s for a measuring step of 100 ms in order to give good stabilization of the value for SOH:

$$SOH_n = \frac{x \cdot SOH_{n-1} + (G \cdot H \cdot I) \cdot SOH_{int,n}}{x + (G \cdot H \cdot I)}$$

The index of confidence on the value for battery state of health that is determined can be expressed in the form of the following relation:

IndConf_SOH$_n$=[x*IndConf_SOH$_{n-1}$+(G*H*I)]/(x+1)

With G, H and I being the confidence coefficients defined above and x being the time constant of the time domain filter.

As explained above, this index of confidence IndConf_SOH$_n$ allows the value for SOH determined at a given point in time to be treated by giving it greater or lesser importance in the electronic battery management system.

Figure 5:
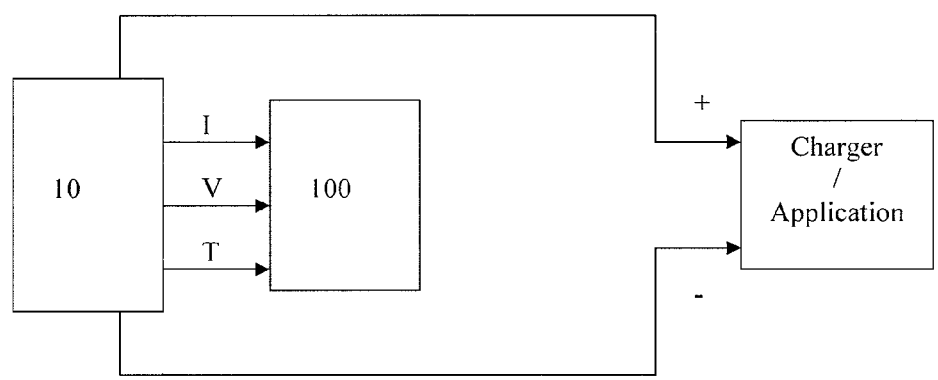
FIG. 5 is a block diagram of a system according to the invention.

FIG. 5 shows diagrammatically a system according to the invention. Battery 10 is designed to be electrically connected to an application (to supply a current) or to a charger (for recharging its cells). An electronic measurement system 100 can be associated to battery 10. Sensors are provided for supplying management system 100 with current, voltage and temperature values. The sensors supply these values in real time, with a measurement step comprised between 10 ms and 1 s.

Electronic management system 100 includes a (microprocessor type) computation circuit for determining, in real time, battery state of health using one of the embodiments described above. The computation circuit of the electronic management system 100 can also calculate an index of confidence for the value of state of health at a given point in time, as per one of the embodiments described above. Starting from the value for battery state of SOH$_n$ and associated index of confidence IndConf_SOH$_n$, electronic management system 100 can optimize battery use as a function of differing logics. The electronic management system 100 can notably control interruption of charging and/or sending of alarm signals to the application.

The embodiments described above and the FIGS. should be considered as having an illustrative and non-limiting aim, and the invention should not be considered to be limited to the details given here but can be subject to modification while remaining within the scope of the attached claims. In particular, the weighting functions can be adapted depending on the type of battery and the applications.

The invention claimed is:

1. A method for determining the state of health (SOH) of a battery comprising at least one rechargeable cell, the method including the steps of:
   determining a state of charge (SOC) for at least one cell;
   determining in real time an impedance of at least one cell (R$_{mes,n}$);
   determining at least one confidence coefficient accounting on reliability of the impedance as a function of at least one variable selected from current, temperature or state of charge of the at least one rechargeable cell, or the derivatives or integrals thereof with respect to time;
   determining in real time the state of health of the battery at a given point in time (SOH$_n$), using the state of health of the battery at a preceding point in time (SOH$_{n-1}$) corrected as a function of said impedance at the given point in time (R$_{mes,n}$) and weighted by the at least one confidence coefficient;
   controlling at least one of charging and use of the battery based on the determined state of health of the battery.

2. The method according to claim 1 further including filtering in the time domain the value of the state of health of the battery determined at said given point in time (SOH$_n$), using a filter time constant (x) selected such that a ratio of filter time constant to time step of the determination (x/(t$_n$−t$_{n-1}$)) is greater than or equal to $10^4$.

3. The method according to claim 1, further including filtering in the time domain the value of the impedance determined at the given point in time (R$_{mes,n}$) using a filter time constant (r) selected such that a ratio of filter time constant to time step of the determination (r/(t$_n$−t$_{n-1}$)) is greater than or equal to 1000.

4. The method according to claim 1, further including calculating an intermediate state of health at said given point in time (SOH$_{int, n}$) as a ratio of impedance at the given point in time (R$_{mes,n}$) to impedance of the cell in its new condition (R$_{new}$) under the same conditions of temperature, wherein determination of state of health of the battery at the given point in time (SOH$_n$) is a function of the state of health of the battery at the preceding point in time (SOH$_{n-1}$) and the calculated intermediate state of health (SOH$_{int,n}$).

5. The method according to claim 4, in which the state of health of the battery at the given point in time (SOH$_n$) is determined using the following relation:

$$SOH_n=SOH_{n-1}+(G \cdot H \cdot I) \cdot SOH_{int,n}.$$

6. The method of claim 5, further including the steps of:
   filtering in the time domain the value of the state of health of the battery determined at said given point in time (SOH$_n$), using a filter time constant (x) selected such that a ratio of filter time constant to time step of the determination (x/(t$_n$−t$_{n-1}$)) is greater than or equal to $10^4$;
   calculating an index of confidence (IndConf_SOH$_n$) for the value of the state of health of the battery determined at the given point in time (SOH$_n$), said index of confidence being calculated as follows:

IndConf_SOH$_n$=[x*IndConf_SOH$_{n-1}$+(G*H*I)]/(x+1), with IndConf_SOH$_{n-1}$ being the index of confidence at the preceding point in time, x being the filter time constant and G, H and I being the confidence coefficients function of current, temperature and state of charge respectively.

7. The method according to claim 1, in which the state of health of the battery at the given point in time (SOH$_n$) is determined using a Boolean method according to the following relations:

If (R$_{mes,n}$)>aa*R$_n$+bb, then SOH$_n$=SOH$_{n-1}$+a*(G*H*I)

otherwise SOH$_n$=SOH$_{n-1}$−b*(G*H*I)

with R$_n$=SOH$_{n-1}$*R$_{new}$, where R$_{new}$ is the value of the impedance of the cell in its new state and aa, bb decimal determining coefficients of the Boolean relation,
G, H and I being the confidence coefficients function of current, temperature and state of charge respectively and
a and b being decimal coefficients for correcting the value of the state of health of the battery at the given point in time.

8. The method according to claim 1, in which the state of health of the battery at the given point in time ($SOH_n$) is determined using a Boolean method according to the following relations:

If $(R_{mes,n}) > aa*R_n + bb$, then $SOH_n = SOH_{n-1} + a*(G*H*I)$ otherwise if $(R_{mes,n}) < (2-aa)*R_n - bb$ then $SOH_n = SOH_{n-1} - a*(G*H*I)$ otherwise $SOH_n = SOH_{n-1}$ with $R_n = SOH_{n-1} * R_{new}$, where $R_{new}$ is the value of the impedance of the cell in its new state and aa, bb decimal determining coefficients of the Boolean relation, G, H and I being the confidence coefficients function of current, temperature and state of charge respectively and a being a decimal coefficient for correcting the value of the state of health of the battery at the given point in time.

9. The method of claim 7 or 8, further including a step of calculating an index of confidence ($IndConf\_SOH_n$) for the value of the state of health of the battery determined at the given point in time ($SOH_n$), said index of confidence being calculated as follows:

$IndConf\_SOH_n = [IndConf\_SOH_{n-1} + a*(G*H*I)]/(1+a)$ with $IndConf\_SOH_{n-1}$ being the index of confidence at the preceding point in time, a being the decimal coefficient for correcting the value of the state of health of the battery at the given point in time and G, H and I being the confidence coefficients function of current, temperature and state of charge respectively.

10. The method according to claim 1, in which a time step $(t_n - t_{n-1})$ for the real time determination is chosen between 10 ms and 1 s.

11. The method according to claim 6, in which a time step $(t_n - t_{n-1})$ for the real time determination is chosen between 10 ms and 1 s.

12. The method according to claim 9, in which a time step $(t_n - t_{n-1})$ for the real time determination is chosen between 10 ms and 1 s.

13. The method according to claim 1, in which determination of the impedance of at least one cell at the given point in time ($R_{mes,n}$) is performed by measuring cell current and voltage.

14. The method according to claim 1, in which determination of the is impedance of at least one cell at the given point in time ($R_{mes,n}$) is performed using a Kalman algorithm.

15. An electronic system for managing state of health (SOH) of a battery comprising at least one rechargeable cell, the system including:
   means for measuring in real time an impedance ($R_{mes,n}$) of at least one cell;
   electronic means adapted to—determine a state of charge (SOC) for at least one cell;
   determine at least one confidence coefficient accounting on reliability of the impedance as a function of at least one variable selected from current, temperature or state of charge of the at least one rechargeable cell, or the derivatives or integrals thereof with respect to time;
   determine in real time the state of health of the battery at a given point in time ($SOH_n$), using the state of health of the battery at a preceding point in time ($SOH_{n-1}$) corrected as a function of said impedance at the given point in time ($R_{mes,n}$) and weighted by the at least one confidence coefficient.

16. The electronic system according to claim 15, further including means for measuring in real time temperature of at least one cell.

17. The electronic system according to claim 15, further including means for controlling battery charging and/or discharge as a function of the state of health (SOH) determined.

18. A battery comprising:
   at least one electrochemical cell;
   an electronic system including:
      means for measuring in real time an impedance ($R_{mes,n}$) of at least one cell;
      means for measuring in real time temperature of at least one cell;
      electronic means adapted to
         determine a state of charge (SOC) for at least one cell;
         determine at least one confidence coefficient accounting on reliability of the impedance as a function of at least one variable selected from current, temperature or state of charge of the at least one rechargeable cell, or the derivatives or integrals thereof with respect to time;
         determine in real time the state of health of the battery at a given point in time ($SOH_n$), using the state of health of the battery at a preceding point in time ($SOH_{n-1}$) corrected as a function of said impedance at the given point in time ($R_{mes,n}$) and weighted by the at least one confidence coefficient.

* * * * *